(12) United States Patent
Brown

(10) Patent No.: US 7,795,148 B2
(45) Date of Patent: *Sep. 14, 2010

(54) METHOD FOR REMOVING DAMAGED DIELECTRIC MATERIAL

(75) Inventor: Ian J. Brown, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 373 days.

This patent is subject to a terminal disclaimer.

(21) Appl. No.: 11/390,193

(22) Filed: Mar. 28, 2006

(65) Prior Publication Data

US 2007/0235411 A1    Oct. 11, 2007

(51) Int. Cl.
    *H01L 21/302* (2006.01)
(52) U.S. Cl. .............. 438/694; 438/696; 438/700; 438/706; 438/795; 216/13; 216/17; 216/41; 216/46; 216/49; 216/58
(58) Field of Classification Search ............... None
    See application file for complete search history.

(56) References Cited

U.S. PATENT DOCUMENTS

| | | | | |
|---|---|---|---|---|
| 5,990,019 A | * | 11/1999 | Torek et al. ............... | 438/723 |
| 6,071,815 A | * | 6/2000 | Kleinhenz et al. ........... | 438/689 |
| 6,451,712 B1 | * | 9/2002 | Dalton et al. .............. | 438/781 |
| 6,541,351 B1 | * | 4/2003 | Bartlau et al. .............. | 438/426 |
| 6,627,539 B1 | | 9/2003 | Zhao et al. | |
| 6,858,532 B2 | * | 2/2005 | Natzle et al. ............... | 438/637 |
| 6,951,821 B2 | * | 10/2005 | Hamelin et al. ............ | 438/706 |
| 7,029,536 B2 | * | 4/2006 | Hamelin et al. ............ | 118/715 |
| 7,288,483 B1 | * | 10/2007 | Brown ........................ | 438/694 |
| 7,510,972 B2 | * | 3/2009 | Nishimura et al. .......... | 438/690 |
| 2001/0053585 A1 | * | 12/2001 | Kikuchi et al. ............. | 438/477 |
| 2005/0095839 A1 | * | 5/2005 | Chang et al. ................ | 438/623 |
| 2005/0153533 A1 | * | 7/2005 | Hoshino et al. ............. | 438/618 |
| 2005/0227494 A1 | * | 10/2005 | Higuchi et al. .............. | 438/706 |
| 2006/0134919 A1 | * | 6/2006 | Hamelin et al. ............ | 438/706 |
| 2006/0194435 A1 | * | 8/2006 | Nishimura et al. .......... | 438/689 |
| 2007/0031609 A1 | * | 2/2007 | Kumar et al. ............... | 427/569 |
| 2007/0049036 A1 | * | 3/2007 | Huang ........................ | 438/700 |
| 2007/0238301 A1 | * | 10/2007 | Cabral et al. ................ | 438/706 |
| 2007/0246442 A1 | * | 10/2007 | America et al. .............. | 216/58 |
| 2007/0298972 A1 | * | 12/2007 | Kent et al. .................. | 505/500 |
| 2008/0171438 A1 | * | 7/2008 | Sinha et al. ................. | 438/689 |
| 2009/0020884 A1 | * | 1/2009 | Lee et al. .................... | 257/774 |

OTHER PUBLICATIONS

U.S. Appl. No. 60/655,904, filed Feb. 25, 2005.*

* cited by examiner

*Primary Examiner*—Anita K Alanko
(74) *Attorney, Agent, or Firm*—Oblon, Spivak, McClelland, Maier & Neustadt, L.L.P.

(57) ABSTRACT

A method for removing a damaged dielectric material following an etch process, an ashing process, or a wet cleaning process is described. A dry, non-plasma removal process is implemented to remove a thin layer of damaged material on a feature following formation of the feature. The dry, non-plasma removal process includes a chemical treatment of the damaged material, followed by a thermal treatment of the chemically treated surface layer. The two steps, chemical and thermal treatment, can be repeated.

25 Claims, 13 Drawing Sheets

METHOD FOR REMOVING DAMAGED DIELECTRIC MATERIAL

BACKGROUND OF THE INVENTION

1. Field of Invention

The present invention relates to a method for performing a removal process on a dielectric film, and more particularly to a method for removing damaged layers on a low dielectric constant (low-k) film following an etching or ashing process.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials during production of the IC. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

While low-k materials are promising for fabrication of semiconductor circuits, the present inventors have recognized that these films also provide many challenges. First, low-k films tend to be less robust than more traditional dielectric layers and can be damaged during wafer processing, such as by etch and plasma ashing processes generally used in patterning the dielectric layer. Further, some low-k films tend to be highly reactive when damaged, particularly after patterning, thereby allowing the low-k material to absorb water and/or react with other vapors and/or process contaminants that can alter the electrical properties of the dielectric layer.

SUMMARY OF THE INVENTION

Accordingly, one embodiment of the present invention is to remove damaged layers on a thin film for use in electronic devices.

Another embodiment of the invention is to remove damaged layers on a low dielectric constant (low-k) film following an etching process an ashing process, or a wet cleaning process.

Still another embodiment of the invention is to use a dry non-plasma etching process to remove damaged layers on a low-k film following a low-k film etching process or ashing process.

These and/or other embodiments of the invention may be provided by a method of treating a dielectric film on a substrate. The method includes disposing the substrate having the dielectric film thereon in a treatment system, wherein a surface layer of the dielectric film has been exposed to an etching plasma, an ashing plasma, or a wet clean chemistry, or any combination of two or more thereof. A dry, non-plasma removal process in performed on the dielectric film to remove the surface layer. The removal process includes exposing the surface layer on the dielectric film to a process gas comprising HF and optionally $NH_3$ in order to chemically alter the surface layer, and thermally treating the chemically altered surface in order to desorb the chemically altered surface layer.

Another aspect of the invention includes a method of forming a feature in a low-k film formed on a substrate. The method includes disposing said substrate having said low-k film thereon in a process chamber and forming a mask pattern on said low-k film, said mask pattern having a pattern feature corresponding to a low-k feature to be formed in said low-k film. The low-k feature is etched in said low-k film using a dry plasma etch process, and a dry non-plasma removal process is performed on said low-k feature to remove a surface layer of said low-k feature that has been at least one of damaged or activated by said plasma etch process.

DETAILED DESCRIPTION OF PREFERRED EMBODIMENTS

Figure 1A:
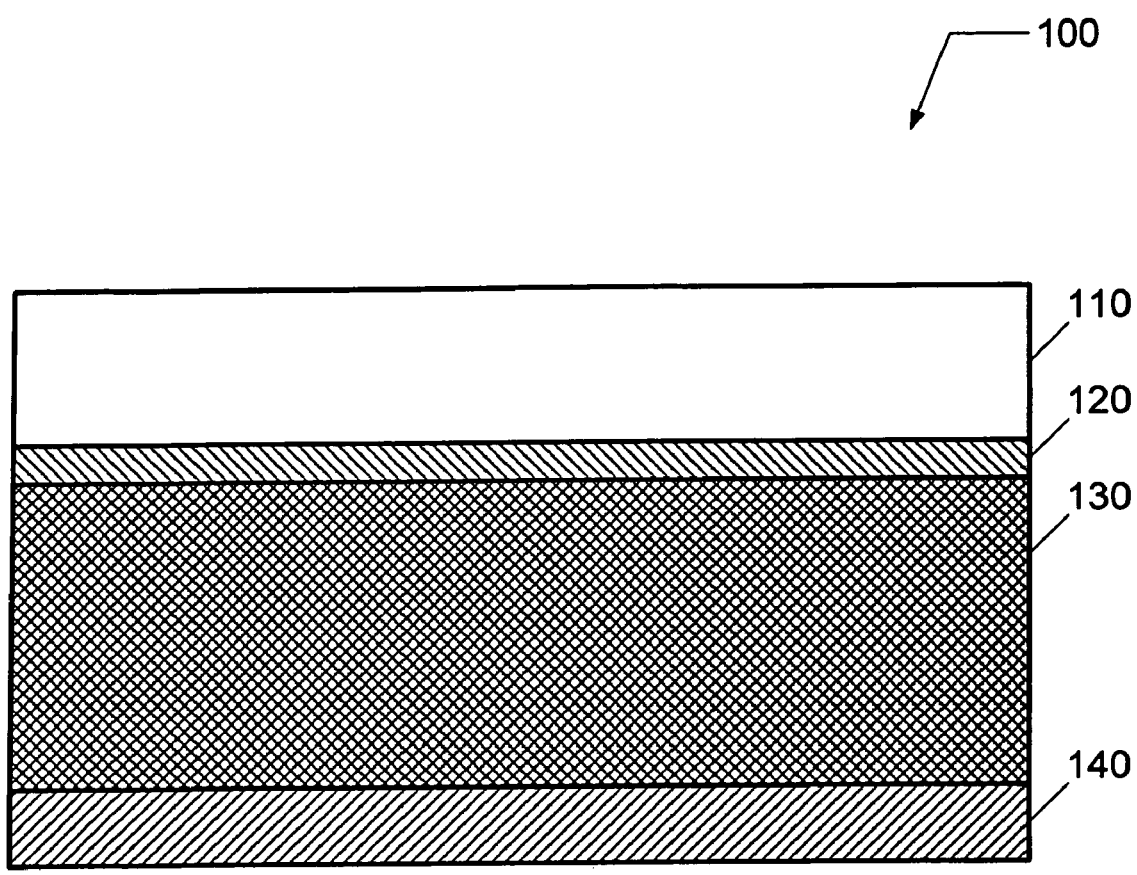
FIGS. 1A through 1G depict an exemplary sequence for processing a substrate when forming a trench or via in a back-end-of-line (BEOL) inter/intra-connect structure.

In the following description, in order to facilitate a thorough understanding of the invention and for purposes of explanation and not limitation, specific details are set forth, such as a particular geometry of the treatment system and descriptions of various components and processes used therein. However, it should be understood that the invention may be practiced in other embodiments that depart from these specific details.

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photoresist), or non-irradiated regions (as in the case of negative resist) using a developing solvent.

Additionally, multi-layer masks and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing including silicon dioxide ($SiO_2$), silicon nitride ($Si_3N_4$), and carbon, for example.

Referring now to the drawings, wherein like reference numerals designate identical or corresponding parts throughout the several views, FIGS. 1A through 1G illustrate a method of forming a pattern in a dielectric film according to an embodiment of the invention. The method combines various aspects of the invention including using a hard mask and treating the exposed surfaces of the etched pattern in the dielectric film in order to remove layers damaged on the dielectric film as a consequence of the dielectric film etching or ashing processes. However, aspects of the process in FIGS. 1A-1G may be used separately from one another as discussed below. Additionally, FIG. 2 presents a flow chart 200 of performing the method according to one embodiment.

Figure 1B:
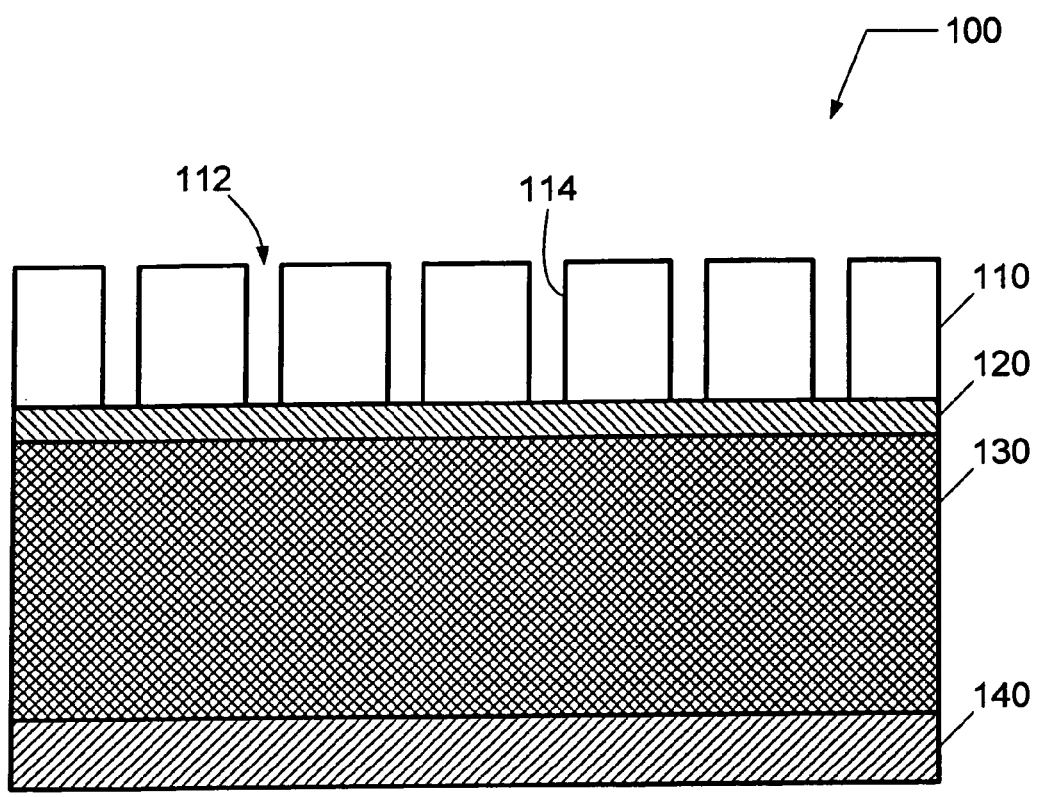
Figure 2:
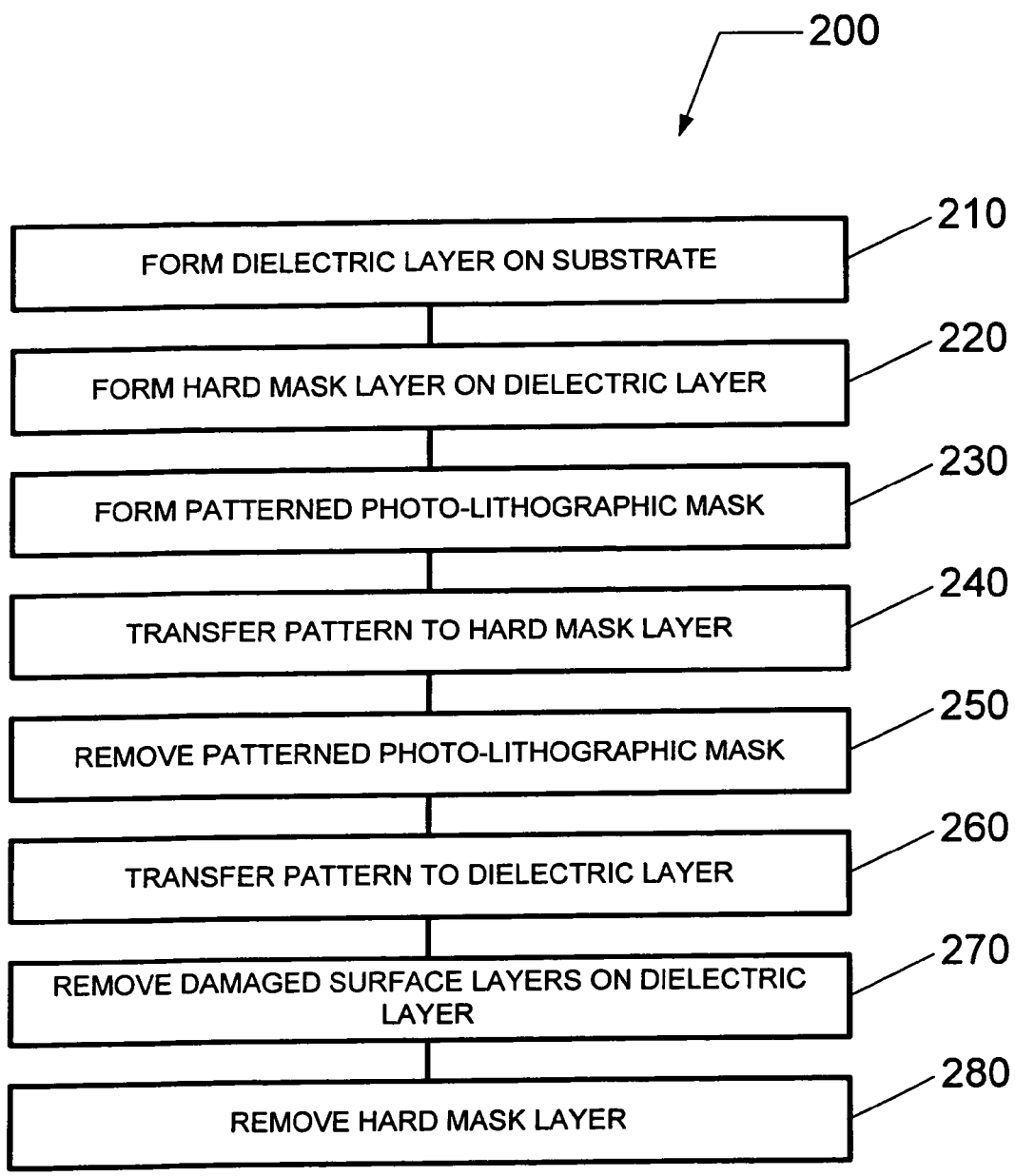
FIG. 2 illustrates a method of processing a substrate according to an embodiment of the invention.

As shown in FIGS. 1A, 1B, and 2, a dielectric film 130 is formed in step 210 on an upper surface of a substrate 140 that may or may not include additional layers. The substrate 140 may be a semiconductor, a metallic conductor, or any other substrate to which the dielectric film is to be formed upon. The dielectric film has a nominal dielectric constant value less than the dielectric constant of $SiO_2$, which is approximately 4 (e.g., the dielectric constant for thermal silicon dioxide can range from 3.8 to 3.9). More specifically, the dielectric film 130 may have a dielectric constant of less than 3.0, or a dielectric constant ranging from 1.6 to 2.7.

The dielectric film 130 can be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate are well known to those skilled in the art of both spin-on dielectric technology and CVD dielectric technology.

The dielectric film 130 can, for example, be characterized as a low dielectric constant (or low-k) dielectric film. The dielectric film 130 may include an organic, inorganic, or inorganic-organic hybrid material or a combination of two or more thereof. Additionally, the dielectric film 130 may be porous or non-porous. For example, the dielectric film may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, for example, porous dielectric films can include single-phase materials, such as a silicon oxide-based matrix having $CH_3$ bonds that are broken during a curing process to create small voids (or pores). Additionally, for example, porous dielectric films can include dual-phase materials, such as a silicon oxide-based matrix having pores of organic material (e.g., porogen) that is evaporated during a curing process.

Alternatively, the dielectric film 130 may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the dielectric film 130 can include an organic material deposited using SOD techniques. Examples of such films include SiLK-I, SiLK-J, SiLK-H, SiLK-D, and porous SiLK semiconductor dielectric resins commercially available from Dow Chemical, and FLARE™, and Nanoglass commercially available from Honeywell.

In the embodiment of FIGS. 1A-1G, once the dielectric film 130 is prepared, a hard mask layer 120 is formed in step 220 on an upper surface thereof. The hard mask layer 120 can include silicon oxide ($SiO_x$), silicon nitride ($Si_yN_z$), and carbon, together, or any combination thereof for example.

Thereafter, a patterned photo-lithographic mask 110 is formed in step 230 on an upper surface of the hard mask 120. The patterned photo-lithographic mask 110 can include a photo-lithographic pattern 112 formed in a layer of light-sensitive material, such as photoresist, using photo-lithography. Alternatively, the patterned mask 110 can include a bilayer mask, or multilayer mask, having an anti-reflective coating (ARC), such as a buried ARC (BARC) layer, a sacrificial DUO™ layer, or a tunable etch resistant ARC (TERA) layer, embedded therein.

For example, the mask layer (or layers), i.e., hard mask layer 120 or patterned photo-lithographic mask 110, can be formed using a track system, or CVD system. The track system can be configured for processing 248 nm resists, 193 nm resists, 157 nm resists, EUV resists, (top/bottom) anti-reflective coatings (TARC/BARC), and top coats. For example, the track system can include a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Additionally, for example, the mask pattern can be formed using any suitable conventional stepping lithographic system, or scanning lithographic system.

Advanced photo-lithography for smaller geometries (i.e., 45 nm, 32 nm, and beyond) is generally constrained by the requirements to: optimize the accurate communication of photo-lithographic pattern 112 to the photo-lithographic layer 110, minimize the thickness of the photo-lithographic layer 110 to prevent pattern collapse, optimize the composition and thickness of the photo-lithographic layer 110 for accurate communication of the pattern 112 from the photo-lithographic layer 110 to the underlying layer, and minimize the transfer of line-edge-roughness (LER) in sidewall 114 of the photo-lithographic pattern 112 to the underlying film.

Conventionally, the mask pattern in a light sensitive layer is transferred to the hard mask layer using a plasma etch process. Due to the anisotropic nature of the plasma etch, the pattern in the light sensitive layer can be transferred to the hard mask layer with high precision. However, this high precision transfer may result in imperfections, such as side wall striations, of the light sensitive layer pattern being transferred to the hard mask, and ultimately to the dielectric feature itself. Further, the low selectivity of plasma etch to the hard mask relative to the light sensitive layer may require a thick light sensitive layer to be used to perform the hard mask etch.

Also in a conventional process using a hard mask, the patterned light sensitive layer is first used to etch the hard mask, and the patterned light sensitive layer and patterned hard mask is subsequently used together to etch the pattern into the dielectric layer. Then, the light sensitive layer and/or residue thereof are removed using a stripping, ashing or wet cleaning process, for example. The present inventors have recognized that exposing the etched dielectric feature to a light sensitive layer removal process can damage the dielectric feature and/or change characteristics of the dielectric material within the dielectric feature. Such damage is in addition to damage of the dielectric feature that can be caused by etching of the feature itself.

Figure 1C:
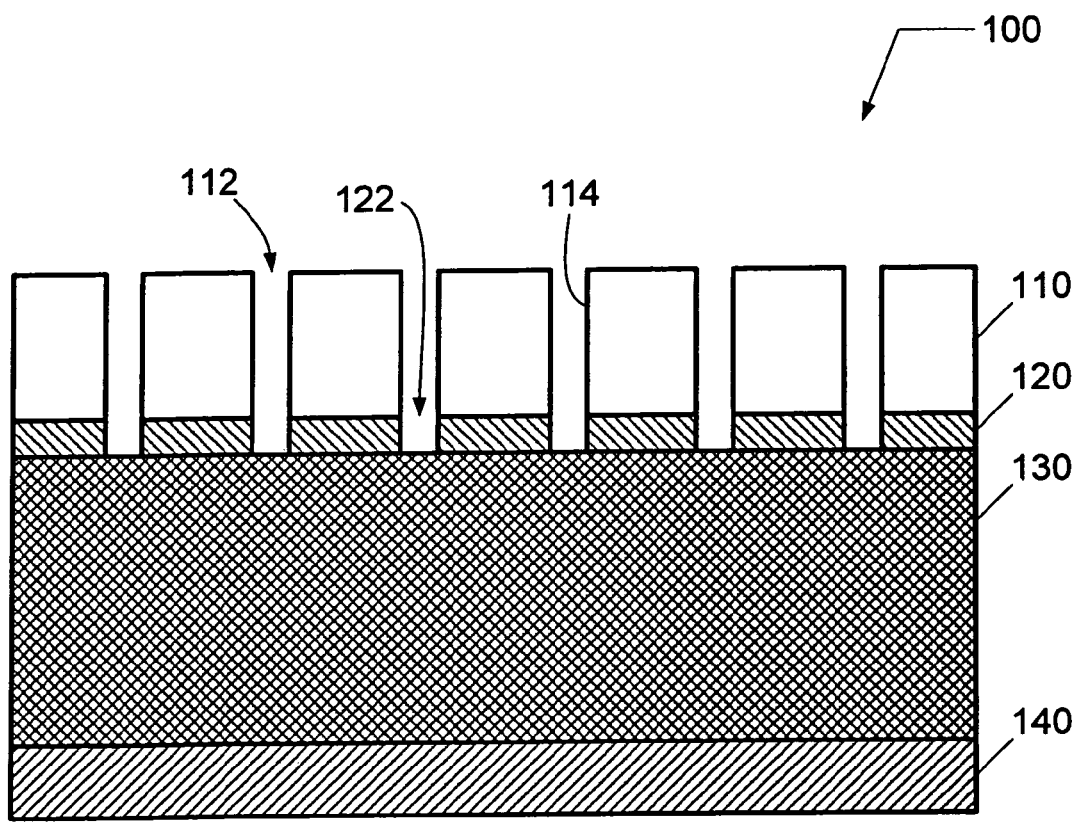
Figure 1D:
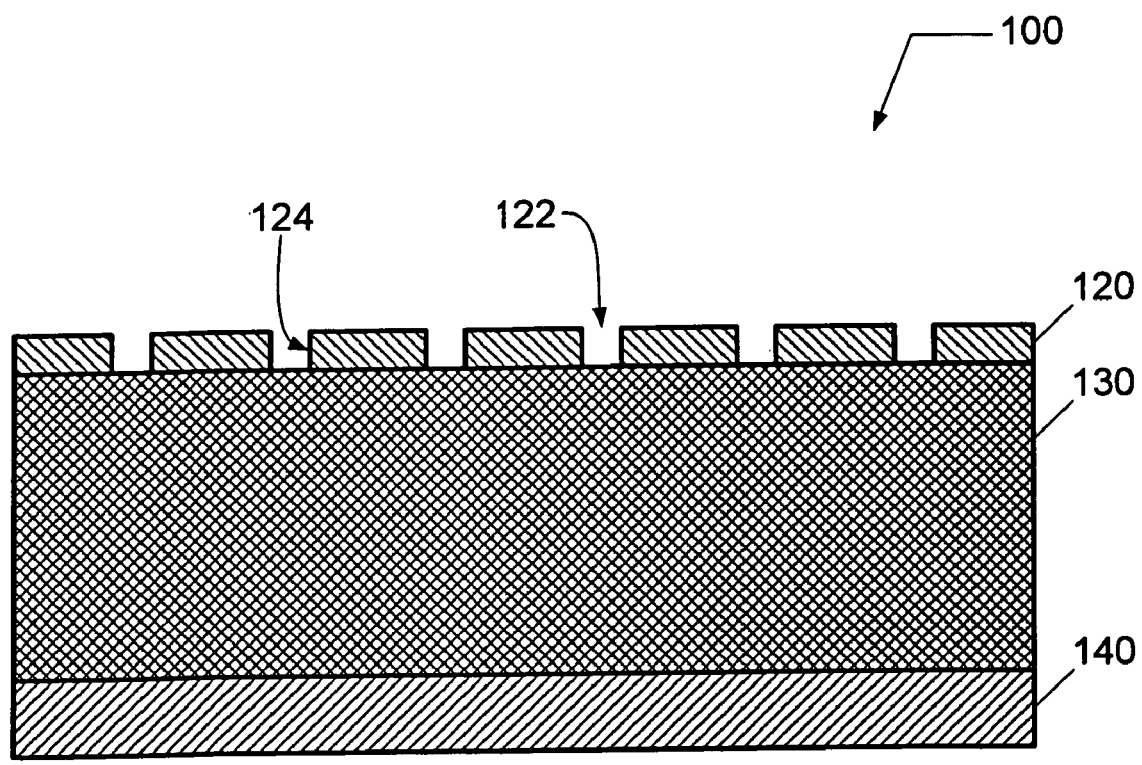

According to one embodiment, as shown in FIGS. 1C and 1D, the photo-lithographic pattern 112 can be transferred in step 240 to the hard mask layer 120 using a dry, non-plasma etching process. The dry, non-plasma etching process is more selective to the hard mask layer material (relative to the photo-lithographic layer material) than a conventional plasma etch process. This higher selectivity can allow use of a relatively thin light sensitive layer, which can reduce the possibility of pattern collapse and allow for the patterning of finer features. Further, the non-plasma etch process includes a self-limiting feature for process control. The dry, non-plasma etching process includes a chemical process during which exposed surfaces of the hard mask layer 120 are chemically treated by a process gas comprising HF, or ammonia ($NH_3$), or both HF and $NH_3$. Exposure to HF and/or $NH_3$ can remove oxide material, such as oxidized silicon (or $SiO_x$), and/or consume oxide material by displacing such material with a chemically treated material. The self limiting feature results from a reduced rate of removal and/or chemical altering of the oxide material as exposure to the process material proceeds. Following the chemical treatment process, a desorption process is performed in order to remove the chemically altered surface layers. Due to the self-limiting feature of the chemical treatment process it may be desirable to alternatingly perform the non-plasma etch and subsequent desorption process, which can allow precise control of the removal process. The desorption process can comprise a thermal treatment process within which the temperature of the substrate is raised sufficiently high to permit the volatilization of the chemically altered surface layers. Using the dry, non-plasma etching process can lead to a hard mask pattern 122 formed in the hard mask layer 120 having reduced LER on sidewalls 124. This advantage may be due to the self limiting feature discussed above and/or the isotropic nature of the non-plasma etch, which can provide smooth lateral etching notwithstanding imperfections in sidewalls of the light sensitive layer. By using a thinner photo-lithographic layer 110 and forming the pattern in the photo-lithographic layer 110 with a finer critical dimension (CD), the isotropy of the dry non-plasma etch can cause a widening of the pattern CD within the hard mask layer 120 to the desired CD while providing a smoothing of the imperfections in the sidewalls of the photo-lithographic layer 120, for example.

During the chemical treatment process of the non-plasma etch, each constituent of the process gas may be introduced together (i.e., mixed), or separately from one another (i.e., HF introduced independently from $NH_3$). Additionally, the process gas can further include an inert gas, such as a noble gas (i.e., argon). The inert gas may be introduced with either the HF or the $NH_3$, or it may be introduced independently from each of the aforementioned gaseous constituents. Further details regarding the introduction of a noble gas with $NH_3$ in order to control the etching of the hard mask layer 120 are chemically altered is described in pending U.S. patent application Ser. No. 10/812,347, entitled "Processing system and method for treating a substrate", the entire contents of which are herein incorporated by reference in their entirety.

Additionally, during the chemical treatment process, the process pressure may be selected to affect the etching of the hard mask layer 120. The process pressure can range from approximately 1 mtorr to approximately 100 torr. Furthermore, during the chemical treatment process, the substrate temperature may be selected to affect the etching of the hard mask layer 120. The substrate temperature can range from approximately 10 degrees C. to approximately 200 degrees C. Further details regarding the setting of the substrate temperature in order to control the etching of the hard mask layer 120 is described in pending U.S. patent application Ser. No. 10/817,417, entitled "Method and system for performing a chemical oxide removal process", the entire contents of which are herein incorporated by reference in their entirety.

During the thermal treatment process, the substrate temperature can be elevated above approximately 50 degrees C., or desirably above approximately 100 degrees C. Additionally, an inert gas may be introduced during the thermal treatment of the substrate. The inert gas may include a noble gas or nitrogen.

Alternatively, the pattern 112 can be transferred in step 240 to the underlying hard mask layer 120 using a dry plasma etching process in combination with the dry non-plasma etching process. For instance, the dry plasma etching process may precede the dry non-plasma etching process, wherein the dry non-plasma etching process is utilized to remove sidewall roughness, etc. That is, the anisotropic nature of a plasma etching process may transfer LER to the hard mask, and the isotropic non-plasma etch may be used to remove and/or smooth such LER. When plasma etching an oxide dielectric film such as silicon oxide, silicon dioxide, etc., the plasma etch gas composition generally includes a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., and at least one of an inert gas, oxygen, and CO.

As noted above, the present inventors have recognized disadvantages of removing the light sensitive layer after etching the dielectric feature. As shown in FIG. 1D, once the hard mask pattern 122 is formed in the hard mask layer 120, the photo-lithographic mask 110 can be removed in step 250 using a wet or dry stripping/ashing process prior to etching the dielectric layer 130. As one advantage, for instance, the removal of the photo-lithographic mask 110 prior to etching the dielectric layer 130 may be simpler, due to the lack of hardened crusts resultant from the dielectric layer etching process. Additionally, for instance, the removal of the photo-lithographic mask 110 prior to the dielectric layer etch minimizes the exposure of dielectric layer 130 to a wet clean process when applying strip chemicals during a wet stripping process, or an ashing process when using an oxidizing plasma to remove photoresist and post-etch residue. Advanced (porous or non-porous) dielectric materials can be damaged when exposed to these etching, stripping and/or ashing processes, and thus, prior removal of the light sensitive layer can minimize damage of the dielectric layer. Further, the above advantages can be realized even where a conventional plasma etch is performed on the hard mask 120.

Figure 1E:
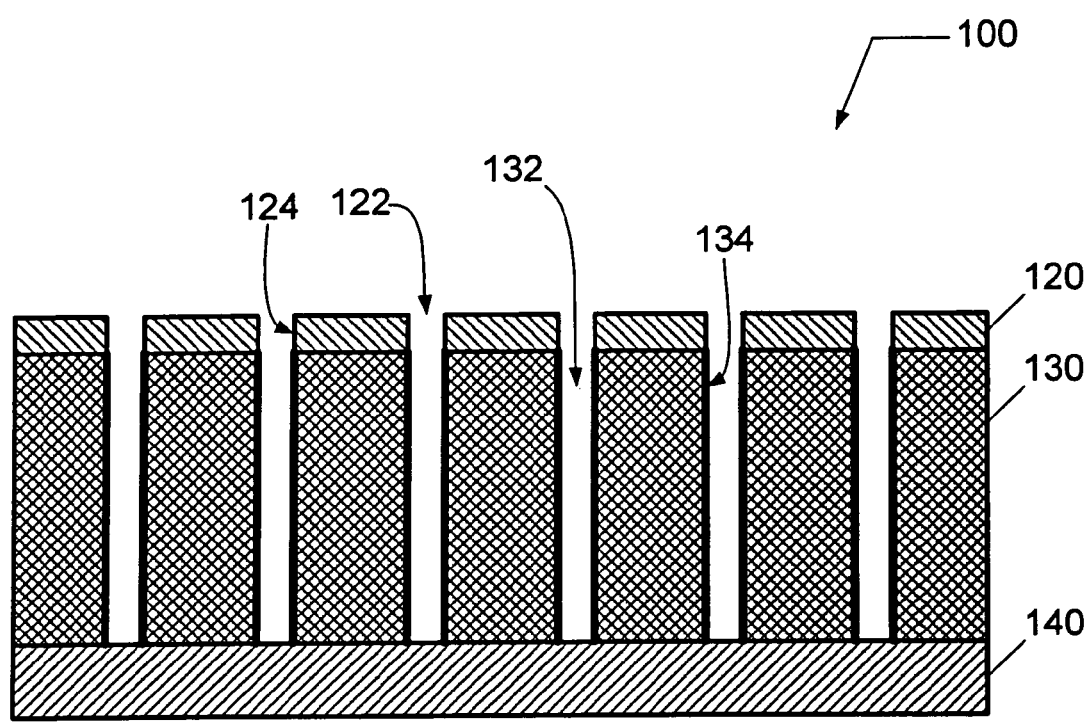

In step 260, as shown in FIG. 1E, hard mask pattern 122 is transferred to dielectric layer 130 using dry plasma etching. For instance, when etching oxide dielectric films such as silicon oxide, silicon dioxide, etc., or when etching inorganic low-k dielectric films such as oxidized organosilanes, the etch gas composition generally includes a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., and at least one of an inert gas, oxygen, and CO. Additionally, for example, when etching organic low-k dielectric films, the etch gas composition generally includes at least one of a nitrogen-containing gas, and a hydrogen-containing gas. The techniques for selectively etching a dielectric film, such as those described earlier, are well known to those skilled in the art of dielectric etch processes.

During etching, exposed surfaces within the feature formed in the dielectric layer 130, such as sidewalls 134, can be damaged, or activated. The damage or activation incurred by these surfaces can lead to the absorption of water, or the adhesion of contaminants and/or chemicals during etch processing (i.e., dry etching of the dielectric layer, or photo-lithographic mask removal during ashing following the dielectric layer etch). For example, porous low-k dielectric films can be very susceptible to damage and/or activation during etch processing. In general, porous low-k films are most commonly silicon-oxide based with silanol (Si—OH) groups and/or organo groups. These materials can become activated or damaged due in part to the depletion of an organic component during etch processing.

In either case, additional silanol groups are exposed which can readily absorb water, and/or other contaminants. Accordingly, device structures with exposed low-k dielectric layers are difficult to handle and maintain contaminant free, especially after patterning steps. Moreover, activation and/or damage to the bulk of the low-k material can result in an increase to the dielectric constant (k-value). It has been observed that the activated or damaged low-k film can exhibit an increase of the k-value by a value of one or more.

Figure 1F:
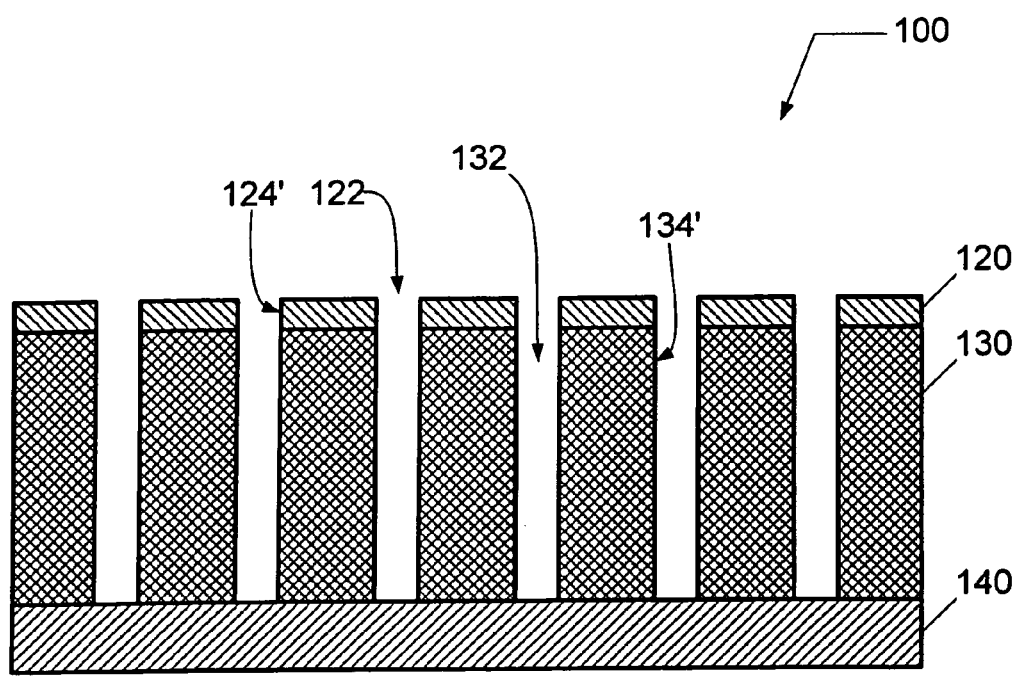

According to an embodiment of the present invention, the damaged, exposed surfaces 134 (following, for example, an etch, or ash process) are removed in step 270 using a dry, non-plasma etching process, as shown in FIG. 1F. As noted above, a dry non-plasma etching process includes a self-limiting feature for process control, which can minimize the amount of the sidewall of feature 132 in dielectric layer 130 that is removed. Further, since the removal of damaged material leads to an increase in the critical dimension (CD) of the features 132, in one embodiment the original pattern (i.e., the photo-lithographic pattern 112) can be selected to be smaller than the design CD for the features 132 in dielectric layer 130 to compensate for the subsequent removal of damaged surface area (e.g., a dielectric film including a feature with a critical dimension less than a predetermined design critical dimension to compensate for a dry non-plasma removal process).

The dry, non-plasma etching process includes a chemical process during which exposed surfaces of the hard mask layer 130 are chemically treated by a process gas comprising HF, or ammonia ($NH_3$), or both HF and $NH_3$. Following the chemical treatment process, a desorption process is performed in order to remove the chemically altered surface layers. The desorption can comprise a thermal treatment process within which the temperature of the substrate is raised sufficiently high to permit the volatilization of the chemically altered surface layers. Using the dry, non-plasma etching process can lead to features 132 in the dielectric layer 130 having reduced damage on sidewalls 134'.

During the chemical treatment process, each constituent of the process gas may be introduced together (i.e., mixed), or separately from one another (i.e., HF introduced independently from $NH_3$). Additionally, the process gas can further include an inert gas, such as a noble gas (i.e., argon). The inert gas may be introduced with either the HF or the $NH_3$, or it may be introduced independently from each of the aforementioned gaseous constituents. Further details regarding the introduction of a noble gas with $NH_3$ in order to control the extent to which surface layers of the dielectric film are chemically altered is described in pending U.S. patent application Ser. No. 10/812,347, entitled "Processing system and method for treating a substrate", the entire contents of which are herein incorporated by reference in their entirety.

Additionally, during the chemical treatment process, the process pressure may be selected to affect the extent to which surface layers of the dielectric film are chemically altered. The process pressure can range from approximately 1 mtorr to approximately 100 torr. Furthermore, during the chemical treatment process, the substrate temperature may be selected to affect the extent to which surface layers of the dielectric film are chemically altered. The substrate temperature can range from approximately 10 degrees C. to approximately 200 degrees C. Further details regarding the setting of the substrate temperature in order to control the extent to which surface layers of the dielectric film are chemically altered is described in pending U.S. patent application Ser. No. 10/817,417, entitled "Method and system for performing a chemical oxide removal process", the entire contents of which are herein incorporated by reference in their entirety.

During the thermal treatment process, the substrate temperature can be elevated above approximately 50 degrees C., or desirably above approximately 100 degrees C. Additionally, an inert gas may be introduced during the thermal treatment of the substrate. The inert gas may include a noble gas or nitrogen.

Figure 1G:
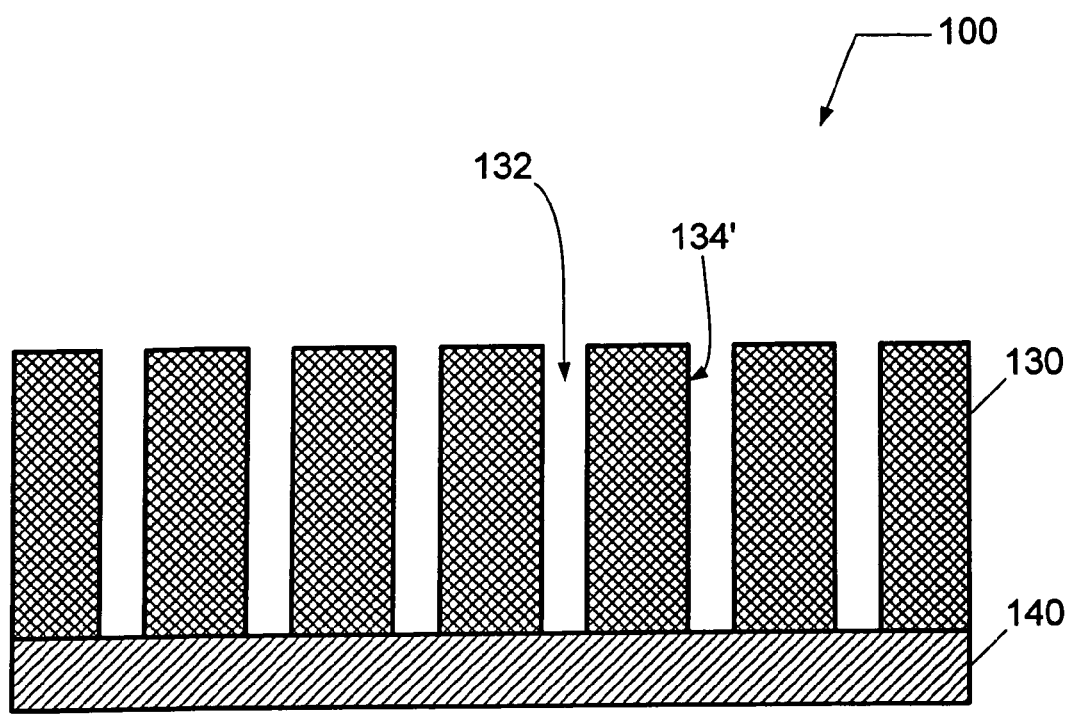

As shown in FIG. 1G, the remaining hard mask layer 120 is removed in step 280 using any one of the dry removal processes described above. Alternatively, the remaining hard mask layer 120 is removed following the metallization of the feature using a planarization process, such as chemical mechanical polishing (CMP).

Figure 3A:
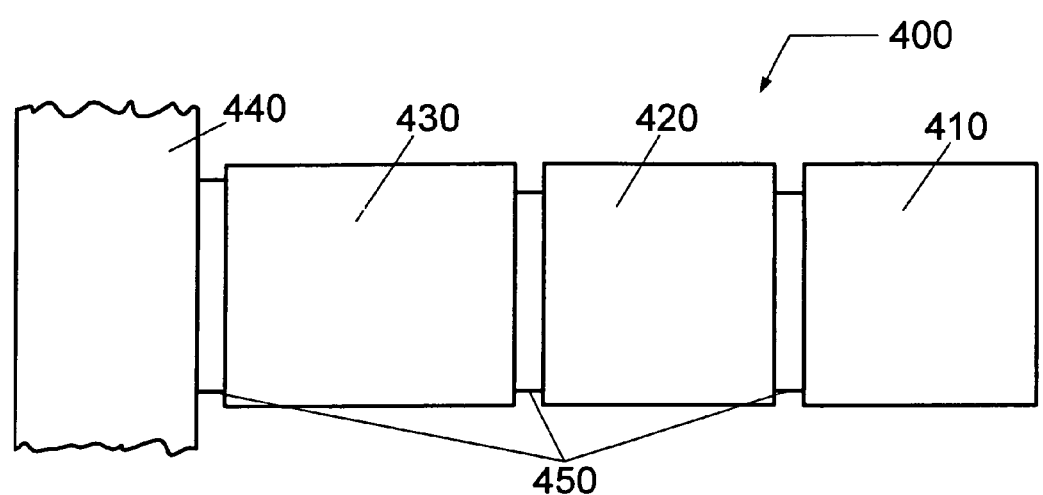
FIGS. 3A through 3C present schematic representations of a treatment system according to another embodiment of the invention.

According to one embodiment, FIG. 3A presents a processing system 400 for performing a dry, non-plasma removal process on a substrate. The processing system 400 comprises a first treatment system 410, and a second treatment system 420 coupled to the first treatment system 410. For example, the first treatment system 410 can comprise a chemical treatment system, and the second treatment system 420 can comprise a thermal treatment system. Alternately, the second treatment system 420 can comprise a substrate rinsing system, such as a water rinsing system.

Also, as illustrated in FIG. 3A, a transfer system 430 can be coupled to the first treatment system 410 in order to transfer substrates into and out of the first treatment system 410 and the second treatment system 420, and exchange substrates with a multi-element manufacturing system 440. The first and second treatment systems 410, 420, and the transfer system 430 can, for example, comprise a processing element within the multi-element manufacturing system 440. For example, the multi-element manufacturing system 440 can permit the transfer of substrates to and from processing elements including such devices as etch systems, deposition systems, coating systems, patterning systems, metrology systems, etc. In order to isolate the processes occurring in the first and second systems, an isolation assembly 450 can be utilized to couple each system. For instance, the isolation assembly 450 can comprise at least one of a thermal insulation assembly to provide thermal isolation, and a gate valve assembly to provide vacuum isolation. Of course, treatment systems 410 and 420, and transfer system 430 can be placed in any sequence.

Figure 3B:
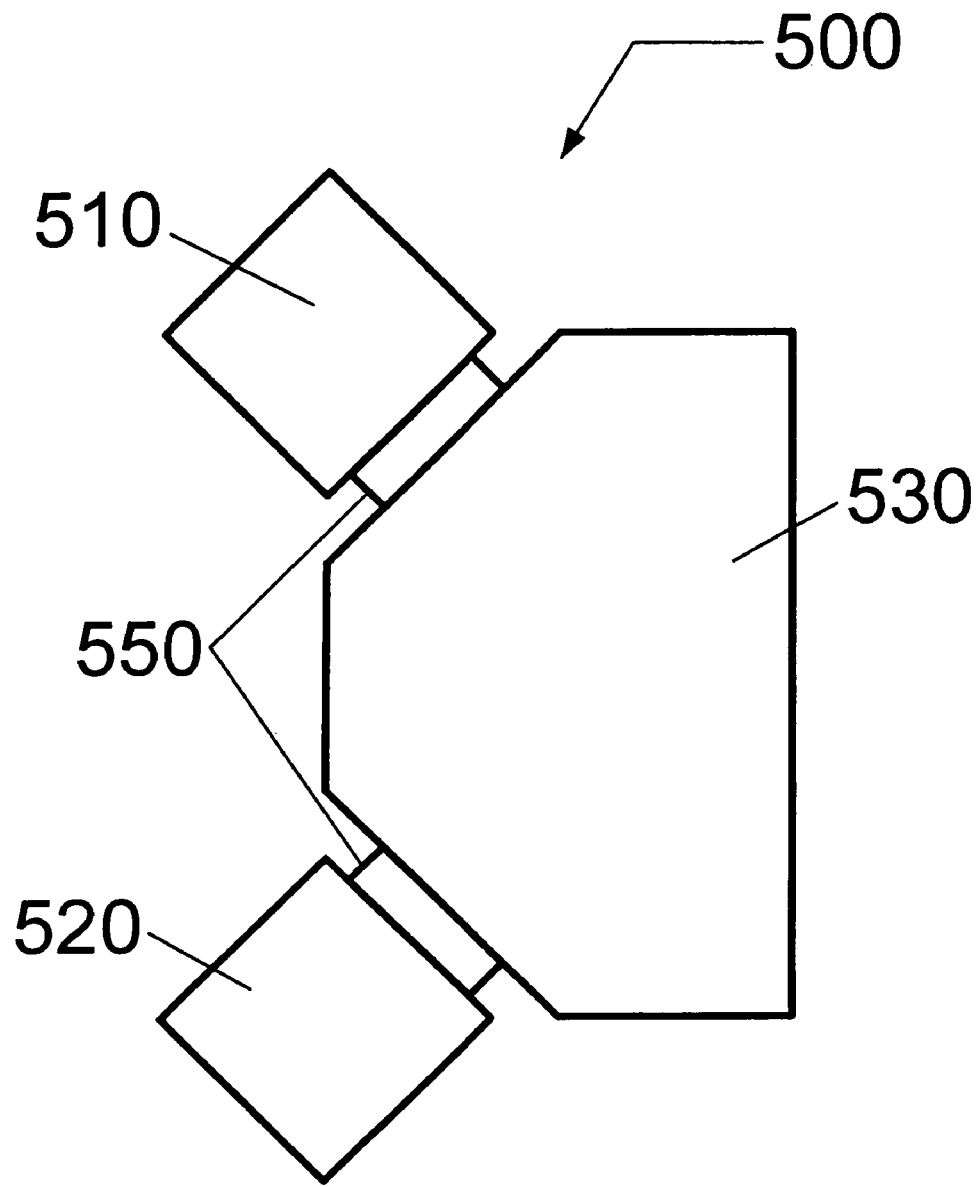

Alternately, in another embodiment, FIG. 3B presents a processing system 500 for performing a dry, non-plasma removal process on a substrate. The processing system 500 comprises a first treatment system 510, and a second treatment system 520. For example, the first treatment system 510 can comprise a chemical treatment system, and the second treatment system 520 can comprise a thermal treatment system. Alternately, the second treatment system 520 can comprise a substrate rinsing system, such as a water rinsing system.

Also, as illustrated in FIG. 3B, a transfer system 530 can be coupled to the first treatment system 510 in order to transfer substrates into and out of the first treatment system 510, and can be coupled to the second treatment system 520 in order to transfer substrates into and out of the second treatment system 520. Additionally, transfer system 530 can exchange substrates with one or more substrate cassettes (not shown). Although only two process systems are illustrated in FIG. 3B, other process systems can access transfer system 530 including such devices as etch systems, deposition systems, coating systems, patterning systems, metrology systems, etc. In order to isolate the processes occurring in the first and second systems, an isolation assembly 550 can be utilized to couple each system. For instance, the isolation assembly 550 can comprise at least one of a thermal insulation assembly to provide thermal isolation, and a gate valve assembly to provide vacuum isolation. Additionally, for example, the transfer system 530 can serve as part of the isolation assembly 550.

Figure 3C:
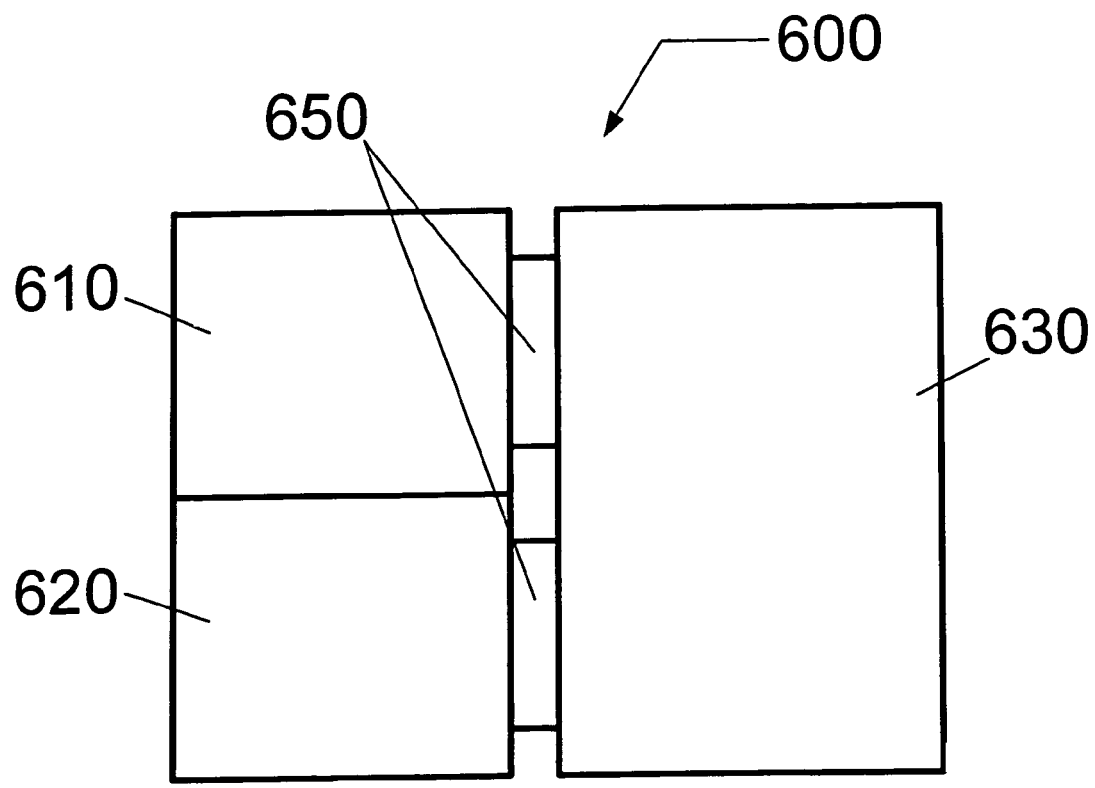

Alternately, in another embodiment, FIG. 3C presents a processing system 600 for performing a dry, non-plasma removal process on a substrate. The processing system 600 comprises a first treatment system 610, and a second treatment system 620, wherein the first treatment system 610 is stacked atop the second treatment system 620 in a vertical direction as shown. For example, the first treatment system 610 can comprise a chemical treatment system, and the second treatment system 620 can comprise a thermal treatment system. Alternately, the second treatment system 620 can comprise a substrate rinsing system, such as a water rinsing system.

Also, as illustrated in FIG. 3C, a transfer system 630 can be coupled to the first treatment system 610 in order to transfer substrates into and out of the first treatment system 610, and can be coupled to the second treatment system 620 in order to transfer substrates into and out of the second treatment system 620. Additionally, transfer system 630 can exchange substrates with one or more substrate cassettes (not shown). Although only two process systems are illustrated in FIG. 3C, other process systems can access transfer system 630 including such devices as etch systems, deposition systems, coating systems, patterning systems, metrology systems, etc. In order to isolate the processes occurring in the first and second systems, an isolation assembly 650 can be utilized to couple each system. For instance, the isolation assembly 650 can comprise at least one of a thermal insulation assembly to provide thermal isolation, and a gate valve assembly to provide vacuum isolation. Additionally, for example, the transfer system 630 can serve as part of the isolation assembly 650.

Figure 4:
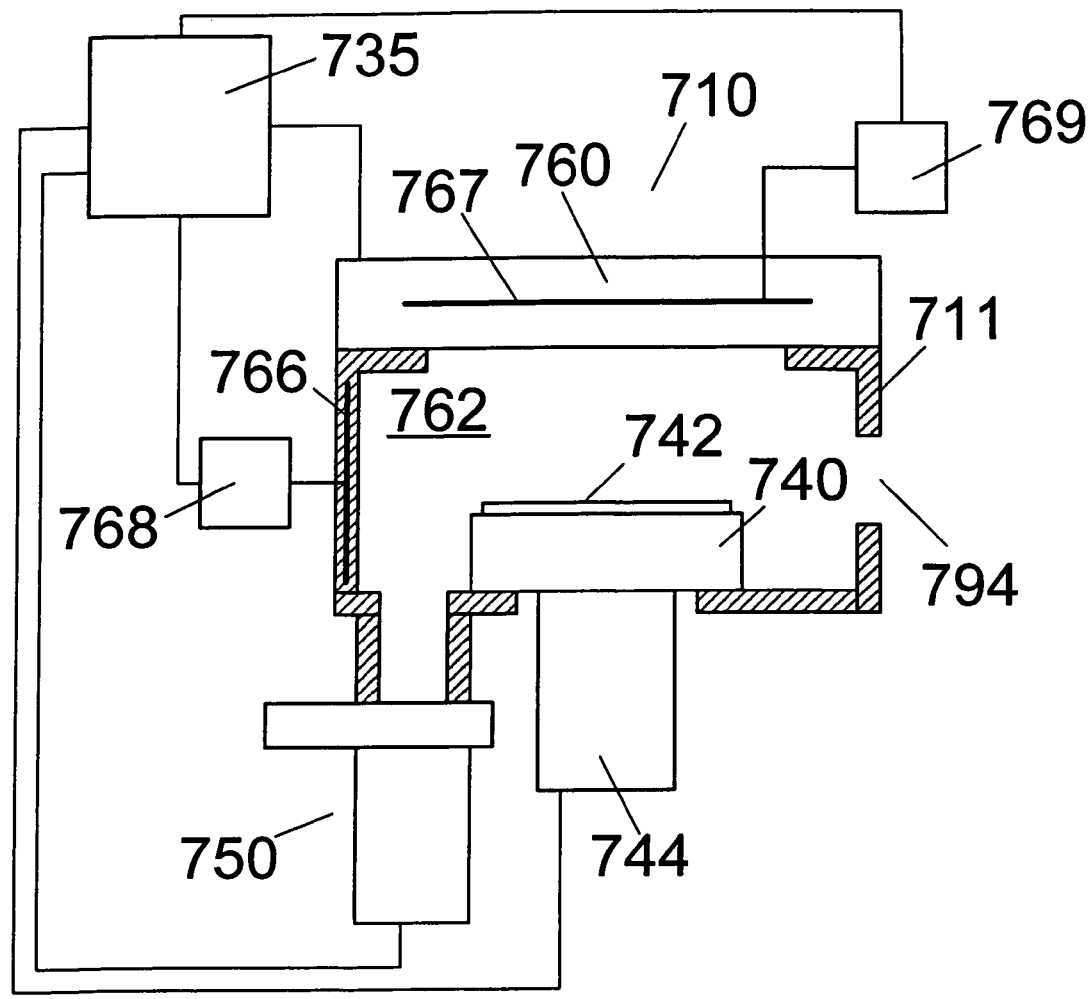
FIG. 4 presents a chemical treatment system according to another embodiment of the invention.

As illustrated in FIG. 4, a chemical treatment system 710 comprises a temperature controlled substrate holder 740 configured to be substantially thermally isolated from the chemical treatment chamber 711 and configured to support a substrate 742, a vacuum pumping system 750 coupled to the chemical treatment chamber 711 to evacuate the chemical treatment chamber 711, and a gas distribution system 760 for introducing a process gas into a process space 762 within the chemical treatment chamber 711. Substrate 742 can be transferred into and out of chemical treatment chamber 711 through transfer opening 794.

Additionally, the chemical treatment system 710 comprises a chamber temperature control element 766 coupled to a chamber temperature control system 768. The chamber temperature control element 766 can include a heating unit, or a cooling unit, or both. Furthermore, the chemical treatment system 710 comprises a gas distribution temperature control element 767 coupled to a gas distribution temperature control system 769. The gas distribution temperature control element 767 can include a heating unit, or a cooling unit, or both.

As illustrated in FIG. 4, the chemical treatment system 710 further comprises substrate holder 740 having a substrate holder assembly 744. Substrate holder assembly 755 can provide several operational functions for thermally controlling and processing substrate 742. For example, the substrate holder 740 and substrate holder assembly 744 may or may not comprise a substrate clamping system (i.e., electrical or mechanical clamping system), a heating system, a cooling system, a substrate backside gas supply system for improved thermal conductance between the substrate 742 and the substrate holder 740, etc.

Referring still to FIG. 4, a controller 735 may be coupled to the substrate holder assembly 744, the gas distribution system 760, the vacuum pumping system 750, the chamber temperature control system 768, and the gas distribution temperature control system 769. The controller 735 can include a microprocessor, memory, and a digital I/O port capable of generating control voltages sufficient to communicate and activate inputs to chemical treatment system 710 as well as monitor outputs from chemical treatment system 710.

Further details regarding the chemical treatment system 710 are described in U.S. Pat. No. 6,951,821 A1, entitled "Processing system and method for chemically treating a substrate"; the entire contents of which are incorporated herein by reference in their entirety.

Figure 5:
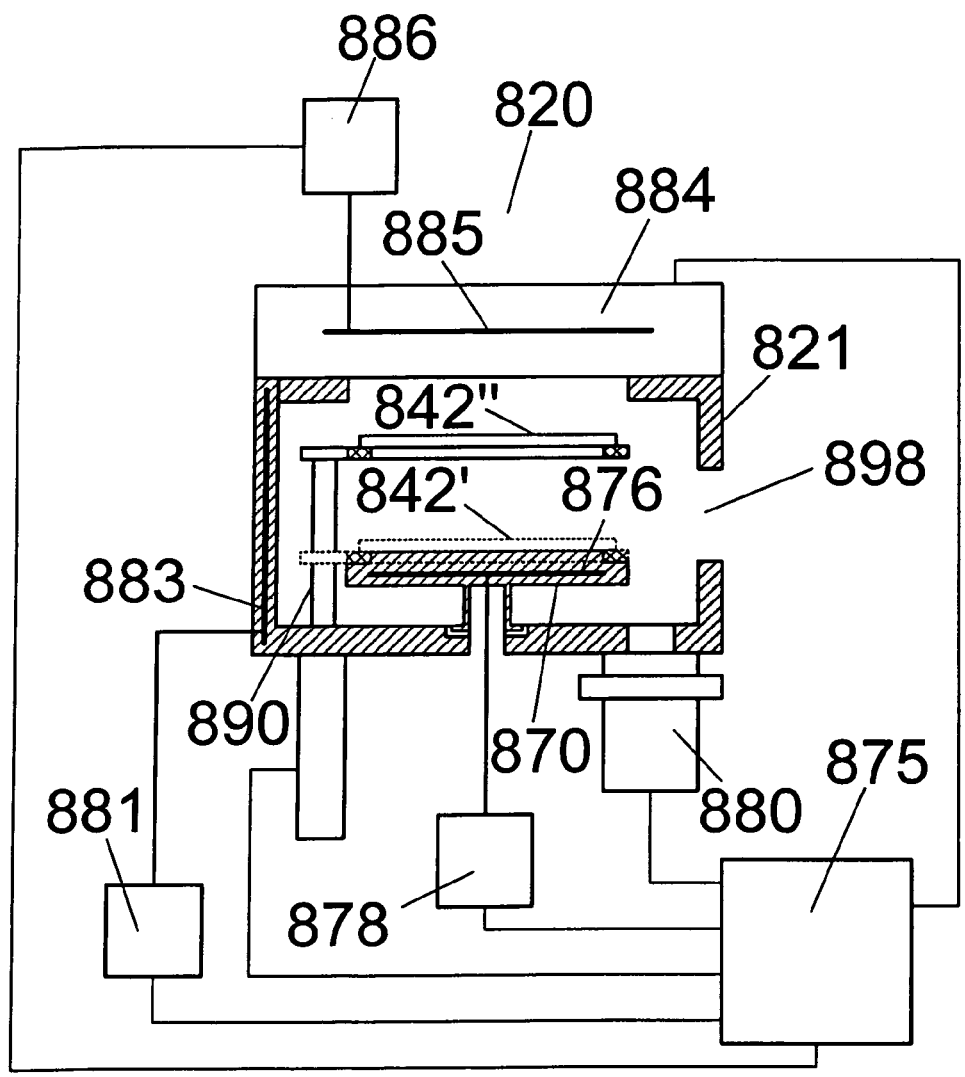
FIG. 5 presents a thermal treatment system according to another embodiment of the invention.

As illustrated in FIG. 5, a thermal treatment system 820 further comprises a temperature controlled substrate holder 870 mounted within the thermal treatment chamber 821 and configured to be substantially thermally insulated from the thermal treatment chamber 821 and configured to support a substrate 842', a vacuum pumping system 880 to evacuate the thermal treatment chamber 821, and a substrate lifter assembly 890 coupled to the thermal treatment chamber 821. Lifter assembly 890 can vertically translate the substrate 842" between a holding plane (solid lines) and the substrate holder 870 (dashed lines), or a transfer plane located therebetween. The thermal treatment chamber 821 can further comprise an upper assembly 884 that may be configured to introduce a process gas, such as a purge gas, during thermal treatment of substrate 842'. Substrate 842' (or 842") can be transferred into and out of chemical treatment chamber 821 through transfer opening 898.

Additionally, the thermal treatment system 820 comprises a chamber temperature control element 883 coupled to a chamber temperature control system 881. The chamber temperature control element 883 can include a heating unit, or a cooling unit, or both. Furthermore, the thermal treatment system 820 comprises an upper assembly temperature control element 885 coupled to an upper assembly temperature control system 886. The upper assembly temperature control element 885 can include a heating unit, or a cooling unit, or both.

As illustrated in FIG. 5, the thermal treatment system 820 comprises substrate holder 870 having a substrate holder temperature control element 876 and a substrate holder temperature control system 878. The substrate holder temperature control element 876 can include a heating element, such as a resistive heating element. Furthermore, for example, the substrate holder 870 may or may not comprise a substrate clamping system (i.e., electrical or mechanical clamping system), an additional heating system, a cooling system, a substrate backside gas supply system for improved thermal conductance between the substrate 842' and the substrate holder 870, etc.

Referring still to FIG. 5, a controller 875 may be coupled to the upper assembly 884, the vacuum pumping system 880, the chamber temperature control system 881, the upper assembly temperature control system 886, the substrate holder temperature control system 878, and the substrate lifter assembly 890. The controller 875 can include a microprocessor, memory, and a digital I/O port capable of generating control voltages sufficient to communicate and activate inputs to thermal treatment system 820 as well as monitor outputs from thermal treatment system 820.

Further details regarding the thermal treatment system 820 are described in pending U.S. patent application Ser. No. 10/704,969, entitled "Processing system and method for thermally treating a substrate"; the entire contents are incorporated herein by reference in their entirety.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A method of treating a dielectric film on a substrate, comprising:
    removing a photo-lithographic mask layer used to transfer a mask pattern to an overlying hard mask layer formed on said substrate;
    etching a feature in said dielectric film using said overlying hard mask layer, after said removing step;
    disposing said substrate having said feature etched in said dielectric film using said overlying hard mask layer in a treatment system, wherein a surface layer of said dielectric film has been exposed to an etching plasma, an ashing plasma, or a wet clean chemistry, or any combination of two or more thereof, causing damage to, or activation of, said surface layer of said dielectric film,
    performing a dry non-plasma removal process on said dielectric film to remove said damaged or activated surface layer, said removal process comprising:
        exposing said surface layer on said dielectric film to a process gas comprising HF or $NH_3$ or a combination thereof in order to chemically alter said surface layer; and
        thermally treating said chemically altered surface layer in order to desorb said chemically altered surface layer; and
    removing said overlying hard mask layer.

2. The method of claim 1, wherein said exposing comprises exposing a surface layer of a dielectric film having a dielectric constant ranging from 1.6 to 2.7.

3. The method of claim 1, wherein said exposing comprises exposing a surface layer of a porous dielectric film or a non-porous dielectric film or a combination thereof.

4. The method of claim 1, wherein said exposing comprises exposing a surface layer of a porous dielectric film comprising a single-phase material or a dual-phase material or a combination thereof.

5. The method of claim 1, wherein said exposing comprises exposing a surface layer of a film including an organic material or an inorganic material or a combination thereof.

6. The method of claim 5, wherein said exposing comprises exposing a surface layer of a film including an inorganic-organic hybrid material.

7. The method of claim 5, wherein said exposing comprises exposing a surface layer of a film including an oxidized organo silane.

8. The method of claim 5, wherein said exposing comprises exposing a surface layer of a film including hydrogen silsesquioxane or methyl silsesquioxane or a combination thereof.

9. The method of claim 5, wherein said exposing comprises exposing a surface layer of a film including a silicate-based material.

10. The method of claim 5, wherein said exposing comprises exposing a surface layer of a collective film including silicon, carbon, and oxygen.

11. The method of claim 10, wherein said exposing further comprises exposing a surface layer of said collective film further including hydrogen.

12. The method of claim 1, wherein said exposing is performed at a process pressure ranging from approximately 1 mtorr to approximately 100 torr.

13. The method of claim 1, wherein said exposing is performed while said substrate is at a temperature ranging from approximately 10 degrees C. to approximately 200 degrees C.

14. The method of claim 1, wherein said exposing comprises exposing said substrate to a process gas further comprising an inert gas.

15. The method of claim 14, wherein said exposing comprises exposing said substrate to a process gas further comprising a noble gas.

16. The method of claim 1, wherein said thermally treating comprises elevating a temperature of said substrate to above approximately 50 degrees C.

17. The method of claim 1, wherein said thermally treating comprises elevating a temperature of said substrate to above approximately 100 degrees C.

18. The method of claim 17, wherein said thermally treating is performed during introducing an inert gas.

19. The method of claim 18, wherein said introducing further comprises introducing a nitrogen.

20. A method of forming a feature in a low-k film formed on a substrate, comprising:
    disposing said substrate having said low-k film thereon in a process chamber;
    forming a hard mask pattern on said low-k film using a photo-lithographic mask layer, said hard mask pattern having a pattern feature corresponding to a low-k feature to be formed in said low-k film;
    removing said photo-lithographic mask layer used to form said hard mask pattern on said low-k film;
    etching said low-k feature in said low-k film using a dry plasma etch process, after said removing step; and
    performing a dry non-plasma removal process on said low-k feature to remove a surface layer of said low-k feature that has been at least one of damaged or activated by said plasma etch process.

21. The method of claim 20, wherein said forming comprises forming a hard mask pattern having a critical dimension less than a critical dimension of said low-k feature in order to compensate for said dry plasma removal process.

22. The method of claim 21, wherein said low-k feature comprises at least one of a interconnect via or a wiring trench or a combination thereof.

23. The method of claim 22, wherein said performing comprises performing a dry non-plasma removal process comprising:
    exposing a surface layer on said low-k feature to a process gas comprising HF or $NH_3$ or a combination of these process gasses in order to chemically alter said surface layer; and
    thermally treating said chemically altered surface layer in order to desorb said chemically altered surface layer.

24. The method of claim 1, wherein said disposing comprises disposing said substrate having said dielectric film that includes a feature with a critical dimension less than a predetermined design critical dimension to compensate for said dry non-plasma removal process.

25. The method of claim 1, wherein the dielectric film is a low-k dielectric film.

* * * * *